US010326439B2

(12) United States Patent
Aubain et al.

(10) Patent No.: US 10,326,439 B2
(45) Date of Patent: Jun. 18, 2019

(54) RF CIRCUIT WITH SWITCH TRANSISTOR WITH BODY CONNECTION

(71) Applicant: QUALCOMM Incorporated, San Diego, CA (US)

(72) Inventors: Max Aubain, Berkeley, CA (US); Clint Kemerling, Rancho Santa Fe, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/845,549

(22) Filed: Dec. 18, 2017

(65) Prior Publication Data

US 2018/0109252 A1  Apr. 19, 2018

Related U.S. Application Data

(63) Continuation of application No. 14/694,707, filed on Apr. 23, 2015, now Pat. No. 9,900,001, which is a continuation of application No. 14/640,377, filed on Mar. 6, 2015, now Pat. No. 9,503,074.

(51) Int. Cl.
| | |
|---|---|
| *H03K 17/687* | (2006.01) |
| *H03K 17/16* | (2006.01) |
| *H03K 3/01* | (2006.01) |
| *H03K 17/693* | (2006.01) |
| *H03K 17/10* | (2006.01) |
| *H03K 17/30* | (2006.01) |

(52) U.S. Cl.
CPC ............ *H03K 17/162* (2013.01); *H03K 3/01* (2013.01); *H03K 17/102* (2013.01); *H03K 17/30* (2013.01); *H03K 17/687* (2013.01); *H03K 17/6871* (2013.01); *H03K 17/693* (2013.01); *H03K 2217/0018* (2013.01)

(58) Field of Classification Search
CPC .......... H03K 17/693; H03K 2217/0018; H01L 27/1203
See application file for complete search history.

(56) References Cited

U.S. PATENT DOCUMENTS

| | | | |
|---|---|---|---|
| 5,689,144 | A | 11/1997 | Williams |
| 5,818,099 | A | 10/1998 | Burghartz |
| 6,201,761 | B1 | 3/2001 | Wollesen |
| 6,469,568 | B2 | 10/2002 | Toyoyama et al. |

(Continued)

OTHER PUBLICATIONS

Botula A., et al., "A Thin-film SOI 180nm CMOS RF Switch Technology," IEEE Topical Meeting on Silicon Monolithic Integrated Circuits in RF Systems, Jan. 2009, pp. 1-4.

(Continued)

*Primary Examiner* — Sibin Chen
(74) *Attorney, Agent, or Firm* — Haynes and Boone, LLP

(57) ABSTRACT

In some method and apparatus embodiments, an RF circuit comprises a switch transistor having a source, a drain, a gate, and a body. A gate control voltage is applied to the gate of the switch transistor. A body control voltage is applied to the body of the switch transistor. The body control voltage is a positive bias voltage when the switch transistor is in an on state. In some embodiments, an RF circuit comprises a control voltage applied to the gate of the switch transistor through a first resistance and applied to the body of the switch transistor through a second resistance. The first resistance is different from the second resistance.

20 Claims, 3 Drawing Sheets

(56) References Cited

U.S. PATENT DOCUMENTS

| | | |
|---|---|---|
| 7,772,648 B1 | 8/2010 | Ivanov et al. |
| 7,910,993 B2 | 3/2011 | Brindle et al. |
| 7,989,889 B1 | 8/2011 | Kerr et al. |
| 8,129,787 B2 | 3/2012 | Brindle et al. |
| 8,164,110 B1 | 4/2012 | Kerr et al. |
| 8,461,903 B1 | 6/2013 | Granger-Jones |
| 8,629,709 B2 | 1/2014 | Iraha et al. |
| 8,723,260 B1 | 5/2014 | Carroll et al. |
| 8,847,672 B2 | 9/2014 | Prabhakar, III et al. |
| 9,160,328 B2 | 10/2015 | Altunkilic et al. |
| 9,197,280 B1 | 11/2015 | Yoo et al. |
| 9,503,074 B2 | 11/2016 | Aubain et al. |
| 2008/0217727 A1 | 9/2008 | Kjar |
| 2011/0025408 A1 | 2/2011 | Cassia et al. |
| 2011/0221519 A1 | 9/2011 | Katoh et al. |
| 2012/0154017 A1 | 6/2012 | Sugiura et al. |
| 2012/0233374 A1 | 9/2012 | Whitefield et al. |
| 2013/0187728 A1 | 7/2013 | Tanji et al. |
| 2014/0002171 A1 | 1/2014 | Nohra |
| 2014/0009203 A1 | 1/2014 | Cebi et al. |
| 2014/0197882 A1* | 7/2014 | Prabhakar, III ..... H01L 27/0629 327/537 |
| 2014/0266415 A1 | 9/2014 | Kerr et al. |
| 2015/0070075 A1 | 3/2015 | Keane |
| 2015/0180470 A1* | 6/2015 | Choi .................. H03K 17/6871 323/312 |
| 2016/0261265 A1 | 9/2016 | Aubain et al. |

OTHER PUBLICATIONS

International Search Report and Written Opinion—PCT/US2016/020908—ISA/EPA—dated Sep. 16, 2016.
McKay T., et al., "Linear Cellular Antenna Switch for Highly-Integrated SOI front-end," IEEE International Sol Conference Proceedings, Oct. 2007, pp. 125-126.
Partial International Search Report—PCT/US2016/020908—ISA/EPO—dated May 23, 2016.
Tinella C., et al., "0.13μm CMOS SOI SP6T Antenna Switch for Multi-Standard Handsets," Topical Meeting on Silicon Monolithic Integrated Circuits in RF Systems, Jan. 2006, pp. 58-61.
Xu H., et al., "A 31.3-dBm Bulk CMOS T/R Switch Using Stacked Transistors With Sub-Design-Rule Channel Length in Floated p-Wells," IEEE Journal of Solid-State Circuits, Nov. 2007, vol. 42 (11), pp. 2528-2534.

* cited by examiner

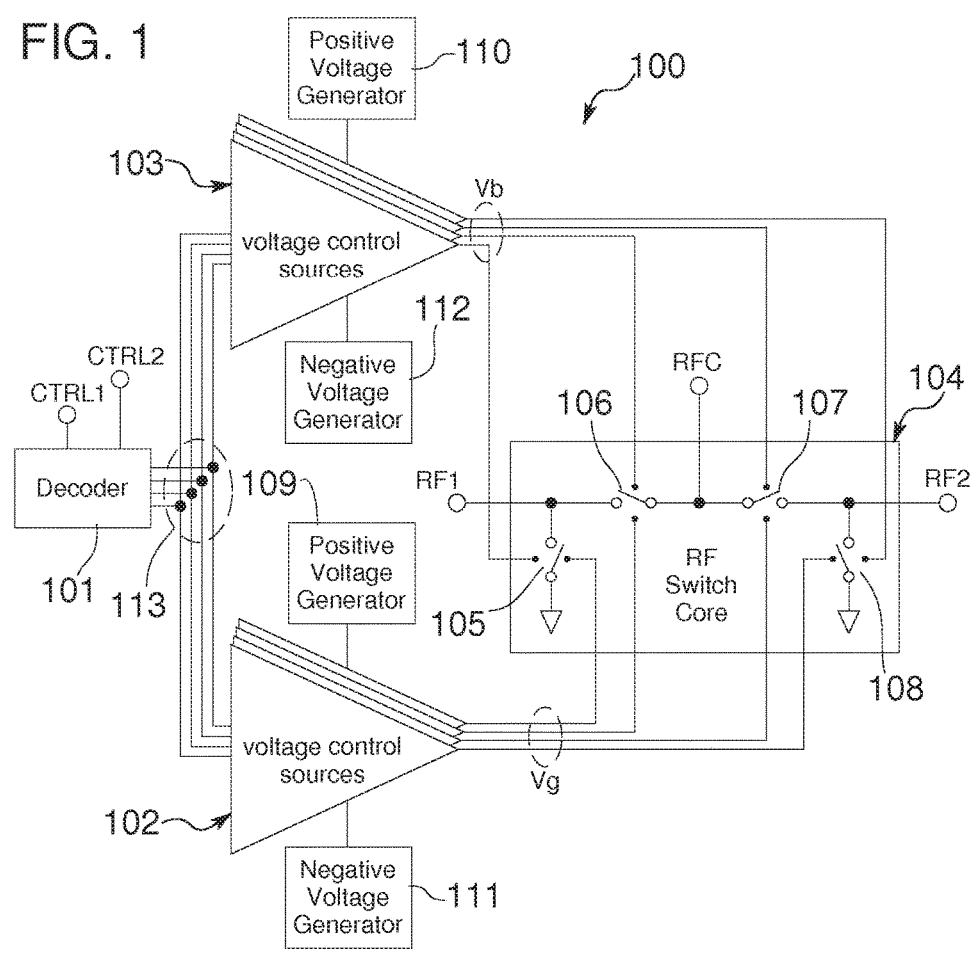
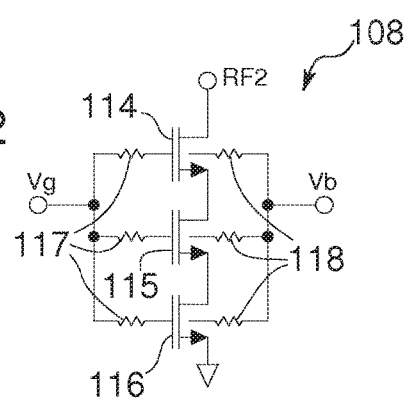

RF CIRCUIT WITH SWITCH TRANSISTOR WITH BODY CONNECTION

CROSS-REFERENCE TO RELATED APPLICATIONS

This patent application is a continuation of U.S. patent application Ser. No. 14/694,707, filed Apr. 23, 2015, which is a continuation of U.S. patent application Ser. No. 14/640,377, filed Mar. 6, 2015 and issued on Nov. 22, 2016 as U.S. Pat. No. 9,503,074, the disclosures of each are hereby incorporated by reference in their entirety.

BACKGROUND OF THE INVENTION

Radio frequency (RF) circuits typically have unwanted harmonic signals generated therein. The harmonic signals are generally caused by nonlinear physical interactions, i.e. capacitance, resistance, and inductance, of components in the RF circuit. The harmonic signals generally reduce the performance of the RF circuit and, thus, of the overall device incorporating the RF circuit. Various techniques have been developed, therefore, to mitigate the harmonic signals and/or their effects within the RC circuits, for example, increasing symmetry of the device layout, reducing semiconductor capacitance through the introduction of a dielectric substrate, using a trap-rich-layer nearby a device to reduce the lifetime of free carriers, etc.

SUMMARY OF THE INVENTION

In some embodiments, an RF circuit comprises a switch transistor having a source, a drain, a gate, and a body. A gate control voltage is applied to the gate of the switch transistor. A body control voltage is applied to the body of the switch transistor. The body control voltage is a positive bias voltage when the switch transistor is in an on state.

In some embodiments, a method comprises applying a gate control voltage to a gate of a switch transistor in an RF circuit; and applying a body control voltage to a body of the switch transistor. The body control voltage is a positive bias voltage when the switch transistor is in an on state.

In some embodiments, an RF circuit comprises a switch transistor having a source, a drain, a gate, and a body. A control voltage applied to the gate of the switch transistor through a first resistance and applied to the body of the switch transistor through a second resistance. The first resistance is different from the second resistance.

Some embodiments involve a first voltage control source that produces the gate control voltage and a second voltage control source that produces the body control voltage. In some embodiments, the positive bias voltage when the switch transistor is in the on state is greater than about 0.7 volts. In some embodiments, the positive bias voltage improves device linearity, such as harmonic signals and/or intermodulation distortion, of the RF circuit when the switch transistor is in the on state. In some embodiments, the harmonic signal is at three times a fundamental frequency of the RF circuit.

BRIEF DESCRIPTION OF THE DRAWINGS

FIG. 1 is a simplified electronic schematic diagram of an RF circuit incorporating an embodiment of the present invention.

FIG. 2 is a simplified electronic schematic diagram of an RF switch for use in the RF circuit shown in FIG. 1 in accordance with an embodiment of the present invention.

DETAILED DESCRIPTION OF THE INVENTION

Figure 3:
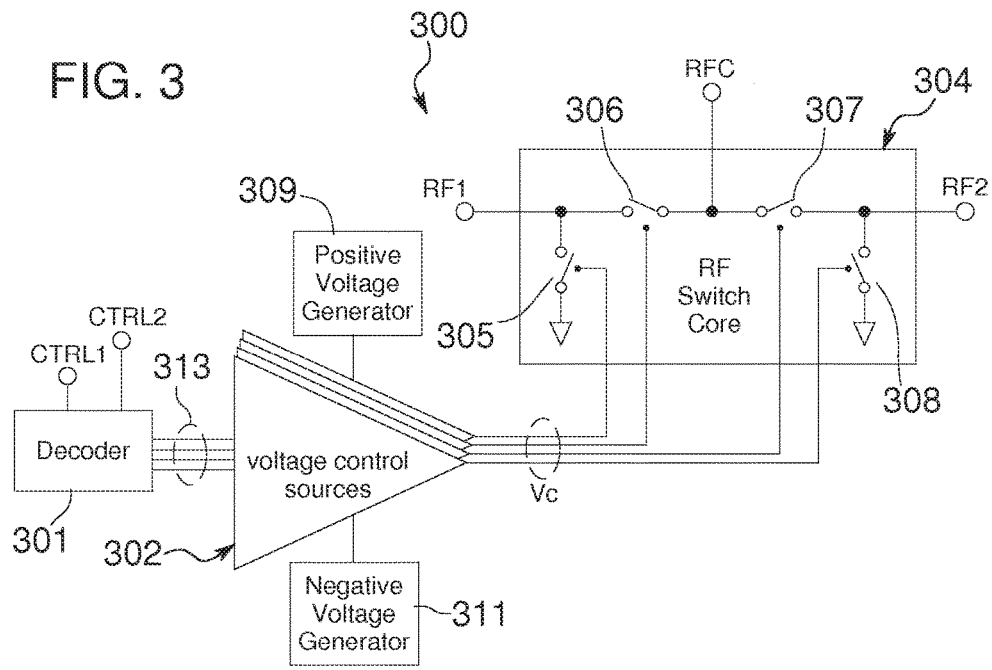
FIG. 3 is a simplified electronic schematic diagram of another RF circuit incorporating an alternative embodiment of the present invention.

A portion of an RF circuit 100 incorporating an embodiment of the present invention is shown in FIG. 1. The RF circuit 100 generally includes a decoder 101, two sets of voltage control sources 102 and 103, and an RF switch core 104. The RF switch core 104 generally includes RF switches 105-108 connected as shown between nodes RFC, RF1, and RF2. The RF switches 105-108 are described in more detail below with respect to FIG. 2, but generally include switch field effect transistors (SWFETs) that have a source, a drain, a gate, and a body (i.e., a four-terminal SWFET configuration). During operation of the RF circuit 100, the SWFETs of the RF switches 105-108 turn on and off and pass an RF carrier signal (when on) between node RFC and the other nodes (RF1 and RF2). Improvement to device linearity, such as harmonics and intermodulation distortion, due to the body tie can be implemented in both the "on" and "off" states of the SWFETs. During the on state, in particular, the body of the SWFETs 105-108 receives a body control voltage Vb that is positively biased. This positive body control bias voltage feature is contrasted with conventional RF circuit techniques in which the body bias voltage is held to zero volts or is allowed to float at approximately zero, because the positive body control bias voltage produced unexpected results regarding improved linearity, such as enhanced mitigation of harmonic signals, improved Intermodulation distortion and improved performance of the RF circuit 100, compared to the conventional techniques. The linearity improvement generally occurs with a relatively high positive, or "substantially" positive, value for the body control voltage Vb greater than about 0.7-1 volts or between about 0.7-1 volts and about 5 volts. (The body control voltage Vb is sometimes described herein as being applied to the body of the SWFETs 105-108, but the body control voltage Vb may actually be applied through an appropriate resistance before reaching the body of the SWFETs 105-108 in some embodiments, unless otherwise specified herein. When applied through the resistance, the actual bias voltage at the body may be limited by the usual built-in p-n junction diode of the SWFETs 105-108.)

Node RFC generally connects to an antenna in the RF circuit 100 to receive and send the RF carrier signal. Nodes RF1 and RF2 generally connect to circuit components "downstream" in the RF circuit 100. (The term "downstream" is not necessarily fully descriptive of the direction of propagation of the RF carrier signal, because the RF carrier signal can be received and/or transmitted in both directions. Thus, the node RFC may be referred to as the "upstream node" or "antenna side node" or other appropriate designation. Additionally, the nodes RF1 and RF2 may be referred to as the "downstream nodes" or "internal nodes" or other appropriate designation.) The RF switch core 104 generally provides the paths for routing the RF carrier signal to and from the downstream, or internal, circuit components. In the illustrated embodiment, only two paths to two downstream nodes (RF1 and RF2) are shown. However, other embodiments may have any number of paths and downstream nodes.

The voltage control sources 102 and 103 may be any appropriate components that can produce the control voltages as described herein. In the illustrated embodiment, for example, the voltage control sources 102 and 103 may be voltage level shifters that operate under control of positive voltage generators 109 and 110 and negative voltage generators 111 and 112 to produce gate control voltages Vg and the body control voltages Vb. The first voltage control sources 102 generate the gate control voltages Vg for the RF switches 105-108, and the second voltage control sources 103 generate the body control voltages Vb for the RF switches 105-108. The RF switches 105-108, thus, operate under control of the gate and body control voltages Vg and Vb. The gate control voltages Vg, for example, generally turn the RF switches 105-108 on and off. When on, the RF switches 105-108 pass a carrier signal in an RF frequency range, e.g., with a fundamental frequency of about 900 MHz. During the on state, the gate control voltages Vg may be greater than the threshold voltage Vt, or between about +2.5 to +5 volts. Additionally, the body control voltages Vb generally bias the body of the SWFETs of the RF switches 105-108 as needed, including the positive body control bias voltage mentioned above for mitigating harmonic signals in, and improving the performance of, the RF circuit 100 during the on state of the RF switches 105-108. In some embodiments, during the off state, the body of the SWFETs 105-108 receive a negatively biased body control voltage Vb.

The decoder 101 may be any appropriate component (or components) that generally receives control signals CTRL1 and CTRL2 and produces decoded signals 113. The control signals CTRL1 and CTRL2 are generally produced by appropriate control circuitry external to the RF circuit 100. The decoded signals 113 are provided to the voltage control sources 102 and 103. In the illustrated embodiment, as level shifters powered by the positive and negative voltage generators 109-112, the voltage control sources 102 and 103 generally level shift the decoded signals 113 to produce the gate and body control voltages Vg and Vb.

An example embodiment for the RF switch 108 is shown in FIG. 2. This same design could also be applied to switches 105-107. The RF switch 108 generally includes SWFETs 114-116. The SWFETs 114-116 are connected in series (source-to-drain) from RF2 to ground. The gate control voltage Vg from a corresponding one of the voltage control sources 102 is connected through resistances 117 to the gates of the SWFETs 114-116 to switch the SWFETs 114-116 between the on and off states as noted above. Additionally, the body control voltage Vb from a corresponding one of the voltage control sources 103 is connected through resistances 118 to the bodies of the SWFETs 114-116 to provide the desired body biasing as noted above. In some embodiments, the resistances 117 and 118 are not considered as being part of the RF switch 108, but may be optional or located in another part of the RF circuit 100, e.g., at any location between the voltage control sources 102 and 103 and the RF switch 108. Additionally, although the RF switch 108 is shown as having three SWFETs 114-116, other embodiments may use any appropriate number of SWFETs. In the illustrated embodiment, the SWFETs 114-116 are N-channel transistors.

A portion of an RF circuit 300 incorporating an alternative embodiment of the present invention is shown in FIG. 3. The RF circuit 300 generally includes a decoder 301, a set of voltage control sources 302, and an RF switch core 304. The RF switch core 304 generally includes RF switches 305-308 connected as shown between nodes RFC, RF1, and RF2. The RF switches 305-308 are described in more detail below with respect to FIG. 4, but generally include switch field effect transistors (SWFETs) that have a source, a drain, a gate, and a body. During operation of the RF circuit 300, the SWFETs of the RF switches 305-308 turn on and off and pass an RF carrier signal (when on) between node RFC and the other nodes (RF1 and RF2). During an "on" state, the body of the SWFETs 305-308 receive a body control voltage that is positively biased. This positive body control bias voltage feature is contrasted with conventional RF circuit techniques in which the body bias voltage is held to zero volts or is allowed to float at approximately zero, because the positive body control bias voltage produced unexpected results regarding enhanced mitigation of harmonic signals and improved performance of the RF circuit 300 compared to the conventional techniques.

Node RFC generally connects to an antenna in the RF circuit 300 to receive and send the RF carrier signal. Nodes RF1 and RF2 generally connect to circuit components "downstream" in the RF circuit 300. (The term "downstream" is not necessarily fully descriptive of the direction of propagation of the RF carrier signal, because the RF carrier signal can be received and/or transmitted in both directions. Thus, the node RFC may be referred to as the "upstream node" or "antenna side node" or other appropriate designation. Additionally, the nodes RF1 and RF2 may be referred to as the "downstream nodes" or "internal nodes" or other appropriate designation.) The RF switch core 304 generally provides the paths for routing the RF carrier signal to and from the downstream, or internal, circuit components. In the illustrated embodiment, only two paths to two downstream nodes (RF1 and RF2) are shown. However, other embodiments may have any number of paths and downstream nodes.

The voltage control sources 302 may be any appropriate components that can produce the control voltages as described herein. In the illustrated embodiment, for example, the voltage control sources 302 may be voltage level shifters that operate under control of a positive voltage generator 309 and a negative voltage generator 311 to produce control voltages Vc. The control voltages Vc are provided as the gate and body control voltages Vg and Vb described above to the RF switches 305-308. The RF switches 305-308, thus, operate under control of the control voltages Vc. Direct gate control voltages applied to the gates of the RF switches 305-308 and direct body control voltages applied to the bodies thereof are both derived from, or based on, the control voltages Vc, as described below with reference to FIG. 4. The direct gate control voltages, for example, generally turn the RF switches 305-308 on and off. When on, the RF switches 305-308 pass a carrier signal in an RF frequency range, e.g., with a fundamental frequency of about 900 MHz. Additionally, the direct body control voltages generally bias the body of the SWFETs of the RF switches 305-308 as needed for mitigating harmonic signals in, and improving the performance of, the RF circuit 300 during the on state of the RF switches 305-308. Furthermore, during the off state, the body of the SWFETs 305-308 receive a negatively biased body control voltage, since the gate control voltage is negative during the off state and the body control voltage is directly related to the gate control voltage.

The decoder 301 may be any appropriate component (or components) that generally receives control signals CTRL1 and CTRL2 and produces decoded signals 313. The decoded signals 313 are provided to the voltage control sources 302. In the illustrated embodiment, as level shifters powered by the positive and negative voltage generators 309 and 311, the voltage control sources 302 generally level shift the decoded signals 313 to produce the control voltages Vc.

Figure 4:
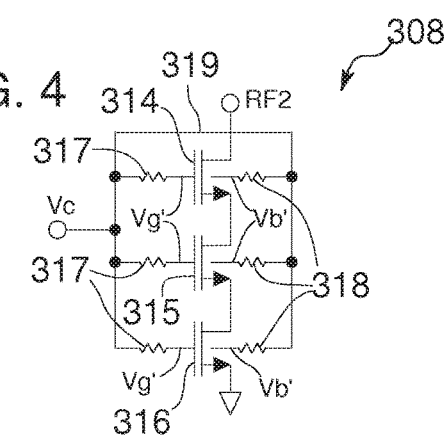
FIG. 4 is a simplified electronic schematic diagram of another RF switch for use in the RF circuit shown in FIG. 3 in accordance with an embodiment of the present invention.

An example embodiment for the RF switch 308 is shown in FIG. 4. This same design could also be applied to switches 305-307. The RF switch 308 generally includes SWFETs 314-316. The SWFETs 314-316 are connected in series (source-to-drain) from RF2 to ground. The single control voltage Vc from a corresponding one of the voltage control sources 302 is connected through resistances 317 to form a direct gate control voltage Vg' that is applied to the gates of the SWFETs 314-316 to switch the SWFETs 314-316 between the on and off states as noted above. Additionally, the control voltage Vc is also connected through resistances 318 to the bodies of the SWFETs 314-316 to form a direct body control voltage Vb' that provides the desired body biasing for mitigating harmonic signals as noted above. In some embodiments, the resistances 317 and 318 have different values, so the direct gate and body control voltages Vg' and Vb' have different values even though resistances 317 and 318 share a common circuit node 319. During the on state, the direct gate control voltages Vg' may be greater than the threshold voltage Vt, or between about +2.5 to +5 volts. Additionally, although the RF switch 308 is shown as having three of the SWFETs 314-316, other embodiments may use any appropriate number of SWFETs. Furthermore, in the illustrated embodiment, the SWFETs 314-316 are N-channel transistors.

In the embodiment of FIGS. 3 and 4, the direct gate and body control voltages Vg' and Vb' are not independent of each other, since they are both based on the same control voltage Vc generated by the same voltage control source 302 and are thus related to each other by the value of the control voltage Vc and the values of (or the ratio of) the resistances 317 and 318. (The resistance values for the resistances 317 and 318 generally range from about 100 kOhm to about 1 MOhm and may have any appropriate ratio between those values of about 1-to-1 up to about 1-to-10; thereby resulting in any appropriate values for, or ratios between, the direct gate and body control voltages Vg' and Vb'.) In the embodiment of FIGS. 1 and 2, on the other hand, the gate and body control voltages Vg and Vb are independent of each other, since they are generated by different voltage control sources 102 and 103 and may thus potentially be completely unrelated to each other. The embodiment of FIGS. 1 and 2, therefore, generally involves the separation of the body and gate bias connections so that they are controlled independently by the different voltage control sources 102 and 103.

The embodiment of FIGS. 3 and 4 may be generally physically smaller (thereby occupying less space on a semiconductor die) than the embodiment of FIGS. 1 and 2, due to having fewer components, e.g., only one set of the voltage control sources 302. On the other hand, the embodiment of FIGS. 1 and 2 may be generally more flexible and may enable greater ranges of control options than can the embodiment of FIGS. 3 and 4, due to the gate and body control voltages Vg and Vb being generated independently by the different voltage control sources 102 and 103.

Figure 5:
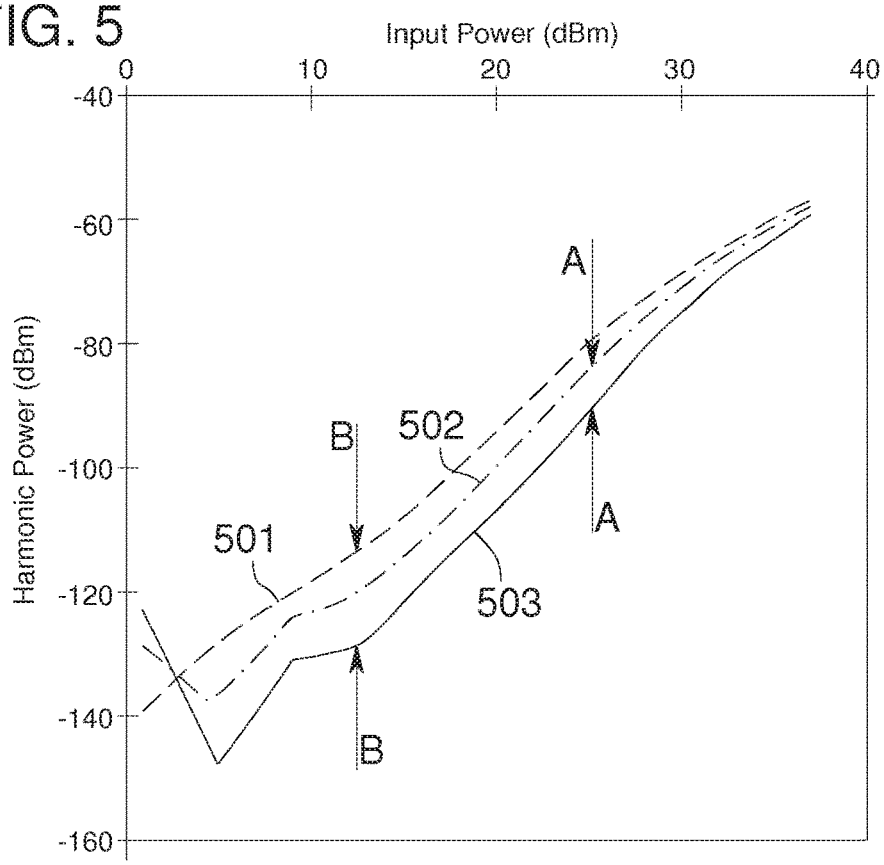
FIG. 5 is a simplified graph of harmonic power vs. input power illustrating the function of an example RF switch incorporating an embodiment of the present invention.

Simplified graphs 501, 502, and 503 of harmonic power vs. input power for a harmonic at three times the fundamental frequency (i.e., the third harmonic, $3f_0$ or H3) of an example RF switch are shown in FIG. 5 in accordance with an embodiment of the present invention. (Additional harmonic signals, other than the third harmonic, may also be improved by embodiments of the present invention.) The function of an example RF switch, e.g., similar to RF switch 108 or 308, was evaluated in a test circuit to generate the graphs 501, 502, and 503. For the SWFETs of the example RF switch, the gate length (Lg) was about 0.19 um and the gate control voltage Vg was about +3 volts. The graph 501 resulted with the body control voltage Vb set to zero volts, the graph 502 resulted with the body control voltage Vb set to +3 volts, and the graph 503 resulted with the body control voltage Vb set to +5 volts.

As indicated by the graphs 501-503, in general there is an improvement in the third harmonic throughout an input power range of about 5-35 dBm, with greater improvement at the lower input power values, except near zero. For example, when the input power is less than about 25 dBm, there is almost a −10 dB improvement (indicated by arrows A-A) in the third harmonic with the body control voltage Vb set to +5 volts (graph 503) compared to when the body control voltage Vb is set to +3 volts (graph 502). Additionally, the example with the body control voltage Vb at zero volts (graph 501) generally represents a configuration similar to the conventional techniques with a floating body or a body held to zero volts. For this case, there is a greater than −15 dB improvement (indicated by arrows B-B) in the third harmonic between the body control voltage Vb at +5 volts (graph 503) and the body control voltage Vb at zero volts (graph 501) with an input power of about 5-15 dBm. Therefore, although the graphs 501-503 generally converge at high input power levels, the graphs 501-503 indicate an improvement in the third harmonic in the performance of the example RF switch due to implementations of the present invention.

Figure 6:
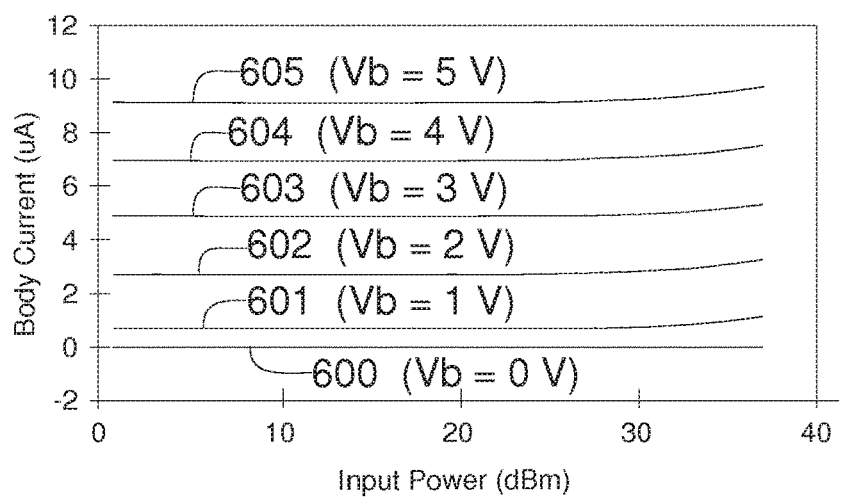
FIG. 6 is a simplified graph of body current vs. input power illustrating the function of an example RF switch incorporating an embodiment of the present invention.

The example RF switch that provided the information for the graphs 501-503 in FIG. 5 had a relatively high value resistor of about 500 kOhm in series with the body diode. In this manner, the body current was limited once the diode became forward biased, which occurred approximately when the body control voltage Vb became greater than about 0.7 volts. FIG. 6 shows a graph of the body current vs. input power further illustrating the function of the example RF switch in accordance with an embodiment of the present invention. Graphs 600-605 are for each integer value of the body control voltage Vb from 0-5 volts, respectively.

When the body control voltage Vb is greater than about 0.7 volts, i.e., above the built-in p-n junction diode of the SWFET, the body current is generally linearly dependent on the body control voltage Vb, implying the current is limited by the body resistor, dictated by Ohm's Law: V=IR. There is benefit to the design of the body resistor value remaining independent of the gate resistor value, because the gate resistor value determines the charge/discharge time of the gate switching and the interaction of the RF switch with charge pumps (not shown).

At higher input power (e.g., above approximately 25-30 dBm), an additional transistor effect (possibly hot carrier generation in the channel) increases the body current, as indicated by an upswing in each of the graphs 601-605. This increase in the body current generally correlates with the convergence of the harmonic power amplitudes at relatively high input power levels, thus indicating a diminishment in the overall harmonics improvement with independent body control voltage Vb.

Reference has been made in detail to embodiments of the disclosed invention, one or more examples of which have been illustrated in the accompanying drawings. Each example has been provided by way of explanation of the present technology, not as a limitation of the present technology. In fact, it will be apparent to those skilled in the art that modifications and variations can be made in the present technology without departing from the spirit and scope thereof. For instance, features illustrated or described as part of one embodiment may be used with another embodiment to yield a still further embodiment. Thus, it is intended that the present subject matter covers all such modifications and variations within the scope of the appended claims and their equivalents.

Although embodiments of the invention have been discussed primarily with respect to specific embodiments thereof, other variations are possible. Various configurations of the described structures or processes may be used in place of, or in addition to, the configurations presented herein.

Those skilled in the art will appreciate that the foregoing description is by way of example only, and is not intended to limit the invention. Nothing in the disclosure should indicate that the invention is limited to systems that are implemented on a single wafer. Nothing in the disclosure should indicate that the invention is limited to systems that require a particular form of semiconductor processing or integrated circuits. Nothing in the disclosure should limit the invention to semiconductor devices based on silicon. In general, any diagrams presented are only intended to indicate one possible configuration, and many variations are possible. Those skilled in the art will also appreciate that methods and systems consistent with the present invention are suitable for use in a wide range of applications encompassing semiconductor structures or electronic circuits.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those skilled in the art, without departing from the spirit and scope of the present invention, which is more particularly set forth in the appended claims.

What is claimed is:

1. A Radio Frequency (RF) switch core comprising:
   a first RF switch coupled in series between an upstream RF node and a downstream RF node, wherein the first RF switch comprises a first series connected plurality of transistors, further wherein each of the transistors of the first series connected plurality of transistors includes a first gate control voltage and a first body control voltage, further wherein the first body control voltage is positively biased higher than the first gate control voltage during an ON state of the first RF switch; and
   a second RF switch coupling the downstream RF node to ground, wherein the second RF switch comprises a second series connected plurality of transistors, further wherein each of the transistors of the second series connected plurality of transistors includes a second gate control voltage and a second body control voltage, further wherein the second body control voltage is positively biased during an ON state of the second RF switch.

2. The RF switch core of claim 1, wherein the first RF switch comprises:
   a first N-channel transistor having a source coupled to a drain of a second N-channel transistor.

3. The RF switch core of claim 2, further wherein the first body control voltage is greater than a built-in p-n junction diode of each of the first N-channel transistor and the second N-channel transistor.

4. The RF switch core of claim 1, wherein the second RF switch comprises:
   a third N-channel transistor having a drain coupled to the downstream RF node and a source coupled to a drain of a fourth N-channel transistor.

5. The RF switch core of claim 4, further wherein the second body control voltage is greater than 0.7V.

6. The RF switch core of claim 1, further comprising:
   a voltage control source configured to produce the first gate control voltage and the first body control voltage as a single control voltage that is applied through a first resistance to gate terminals of the first series connected plurality of transistors and through a second resistance to body terminals of the first series connected plurality of transistors;
   wherein the first resistance is different from the second resistance; and
   wherein the first resistance and the second resistance share a common circuit node.

7. The RF switch core of claim 6, wherein the voltage control source comprises:
   a positive voltage generator;
   a negative voltage generator; and
   a voltage level shifter configured to operate under control of the positive voltage generator and the negative voltage generator.

8. The RF switch core of claim 1, further comprising:
   a first voltage control source configured to produce the first gate control voltage and the second gate control voltage; and
   a second voltage control source configured to produce the first body control voltage and the second body control voltage, wherein the second voltage control source is different from the first voltage control source.

9. The RF switch core of claim 8, wherein:
   the first voltage control source comprises a first level shifter; and
   the second voltage control source comprises a second level shifter.

10. A Radio Frequency (RF) circuit comprising:
    a first RF switch coupled in series between an RF antenna side node and an RF downstream node, wherein the first RF switch comprises a first series connected plurality of transistors, further wherein each transistor of the first series connected plurality of transistors includes a first gate control voltage and a first body control voltage, further wherein the first body control voltage is positively biased higher than the first gate control voltage during an ON state of the first RF switch;
    a second RF switch coupling the RF downstream node to ground, wherein the second RF switch comprises a second series connected plurality of transistors, further wherein each transistor of the second series connected plurality of transistors includes a second gate control voltage and a second body control voltage, further wherein the second body control voltage is positively biased during an ON state of the second RF switch; and means for producing the first gate control voltage, the second gate control voltage, the first body control voltage, and the second body control voltage.

11. The RF circuit of claim 10, wherein the first RF switch comprises:
a first N-channel transistor having a source coupled to a drain of a second N-channel transistor.

12. The RF circuit of claim 10, wherein the second RF switch comprises:
a third N-channel transistor having a drain coupled to the RF downstream node and a source coupled to a drain of a fourth N-channel transistor.

13. The RF circuit of claim 10, wherein the means for producing the first gate control voltage, the second gate control voltage, the first body control voltage, and the second body control voltage comprises:
a voltage control source configured to produce the first gate control voltage and the first body control voltage as a single control voltage that is applied through a first resistance to gate terminals of the first series connected plurality of transistors and through a second resistance to body terminals of the first series connected plurality of transistors;
wherein the first resistance is different from the second resistance; and
wherein the first resistance and the second resistance share a common circuit node.

14. The RF circuit of claim 10, wherein the means for producing the first gate control voltage, the second gate control voltage, the first body control voltage, and the second body control voltage comprises:
a first voltage control source configured to produce the first gate control voltage and the second gate control voltage; and
a second voltage control source configured to produce the first body control voltage and the second body control voltage, wherein the second voltage control source is different from the first voltage control source.

15. A Radio Frequency (RF) circuit for routing an RF carrier signal between an antenna and downstream components of an RF device, the RF circuit comprising:
a first RF switch coupled between the antenna and a downstream node, wherein the first RF switch comprises a first plurality of N-channel transistors connected in series, further wherein each N-channel transistor of the first plurality of N-channel transistors includes a first gate control voltage and a first body control voltage, further wherein the first body control voltage is positively biased higher than the first gate control voltage during an ON state of the first RF switch; and
a second RF switch coupled between the downstream node and ground, wherein the second RF switch comprises a second plurality of N-channel transistors connected in series, further wherein each N-channel transistor of the second plurality of N-channel transistors includes a second gate control voltage and a second body control voltage, further wherein the second body control voltage is positively biased during an ON state of the second RF switch.

16. The RF circuit of claim 15, further wherein the first body control voltage is greater than a built-in p-n junction diode of each of the N-channel transistors of the first plurality of N-channel transistors.

17. The RF circuit of claim 15, wherein the second plurality of N-channel transistors comprises a first N-channel transistor having a drain coupled to the downstream node and a source coupled to a drain of a second N-channel transistor.

18. The RF circuit of claim 15, further comprising:
a voltage control source configured to produce the first gate control voltage and the first body control voltage as a single control voltage that is applied through a first resistance to gate terminals of the first plurality of N-channel transistors and through a second resistance to body terminals of the first plurality of N-channel transistors;
wherein the first resistance is different from the second resistance; and
wherein the first resistance and the second resistance share a common circuit node.

19. The RF circuit of claim 18, wherein the voltage control source comprises:
a positive voltage generator;
a negative voltage generator; and
a voltage level shifter configured to operate under control of the positive voltage generator and the negative voltage generator.

20. The RF circuit of claim 15, further comprising:
a first voltage control source configured to produce the first gate control voltage and the second gate control voltage; and
a second voltage control source configured to produce the first body control voltage and the second body control voltage, wherein the second voltage control source is different from the first voltage control source.

* * * * *